(12) United States Patent
Andreev et al.

(10) Patent No.: US 7,093,228 B2
(45) Date of Patent: Aug. 15, 2006

(54) METHOD AND SYSTEM FOR CLASSIFYING AN INTEGRATED CIRCUIT FOR OPTICAL PROXIMITY CORRECTION

(75) Inventors: Alexandre Andreev, San Jose, CA (US); Ivan Pavisic, San Jose, CA (US); Lav Ivanovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 48 days.

(21) Appl. No.: 10/327,304

(22) Filed: Dec. 20, 2002

(65) Prior Publication Data

US 2004/0123265 A1 Jun. 24, 2004

(51) Int. Cl.
*G06F 17/50* (2006.01)

(52) U.S. Cl. ............................. 716/21; 716/19; 716/20

(58) Field of Classification Search ............ 716/19–21; 430/5, 30, 137; 702/137, 5, 30
See application file for complete search history.

(56) References Cited

U.S. PATENT DOCUMENTS

| | | | | |
|---|---|---|---|---|
| 5,815,685 A | * | 9/1998 | Kamon ........................ 716/21 |
| 5,885,734 A | | 3/1999 | Pierrat et al. |
| 6,064,807 A | * | 5/2000 | Arai et al. .................... 716/21 |
| 6,077,310 A | * | 6/2000 | Yamamoto et al. ........... 716/19 |
| 6,168,891 B1 | * | 1/2001 | Shibata ........................ 430/30 |
| 6,194,104 B1 | * | 2/2001 | Hsu ............................... 430/5 |
| 6,370,679 B1 | * | 4/2002 | Chang et al. ................. 716/19 |
| 6,505,323 B1 | * | 1/2003 | Lipton et al. .................. 716/3 |
| 6,539,521 B1 | * | 3/2003 | Pierrat et al. .................. 716/4 |
| 6,560,766 B1 | * | 5/2003 | Pierrat et al. ................ 716/19 |
| 6,620,561 B1 | * | 9/2003 | Winder et al. ................. 430/5 |
| 2002/0108098 A1 | | 8/2002 | Igeta |
| 2002/0112222 A1 | | 8/2002 | Fischer et al. |
| 2002/0152454 A1 | | 10/2002 | Cote et al. |
| 2003/0074156 A1 | * | 4/2003 | Ikeda et al. ................. 702/137 |
| 2003/0188288 A1 | * | 10/2003 | Kobayashi et al. ........... 716/19 |
| 2004/0019869 A1 | * | 1/2004 | Zhang .......................... 716/11 |
| 2004/0107412 A1 | * | 6/2004 | Pack et al. .................... 716/19 |
| 2004/0133369 A1 | * | 7/2004 | Pack et al. .................... 702/59 |

* cited by examiner

*Primary Examiner*—Stacy A. Whitmore
*Assistant Examiner*—Naum Levin
(74) *Attorney, Agent, or Firm*—Strategic Patent Group, Inc.

(57) ABSTRACT

A method and system for performing optical proximity correction (OPC) on an integrated circuit (IC) chip design is disclosed. The system and method of the present invention includes dividing the IC chip into a plurality of local task regions, identifying congruent local task regions, classifying congruent local task regions into corresponding groups, and performing OPC for each group of congruent local task regions.

By identifying and grouping congruent local task regions in the IC chip, according to the method and system disclosed herein, only one OPC procedure (e.g., evaluation and correction) needs to be performed per group of congruent local task regions. The amount of data to be evaluated and the number of corrections performed is greatly reduced because OPC is not performed on repetitive portions of the IC chip design, thereby resulting in significant savings in computing resources and time.

27 Claims, 5 Drawing Sheets

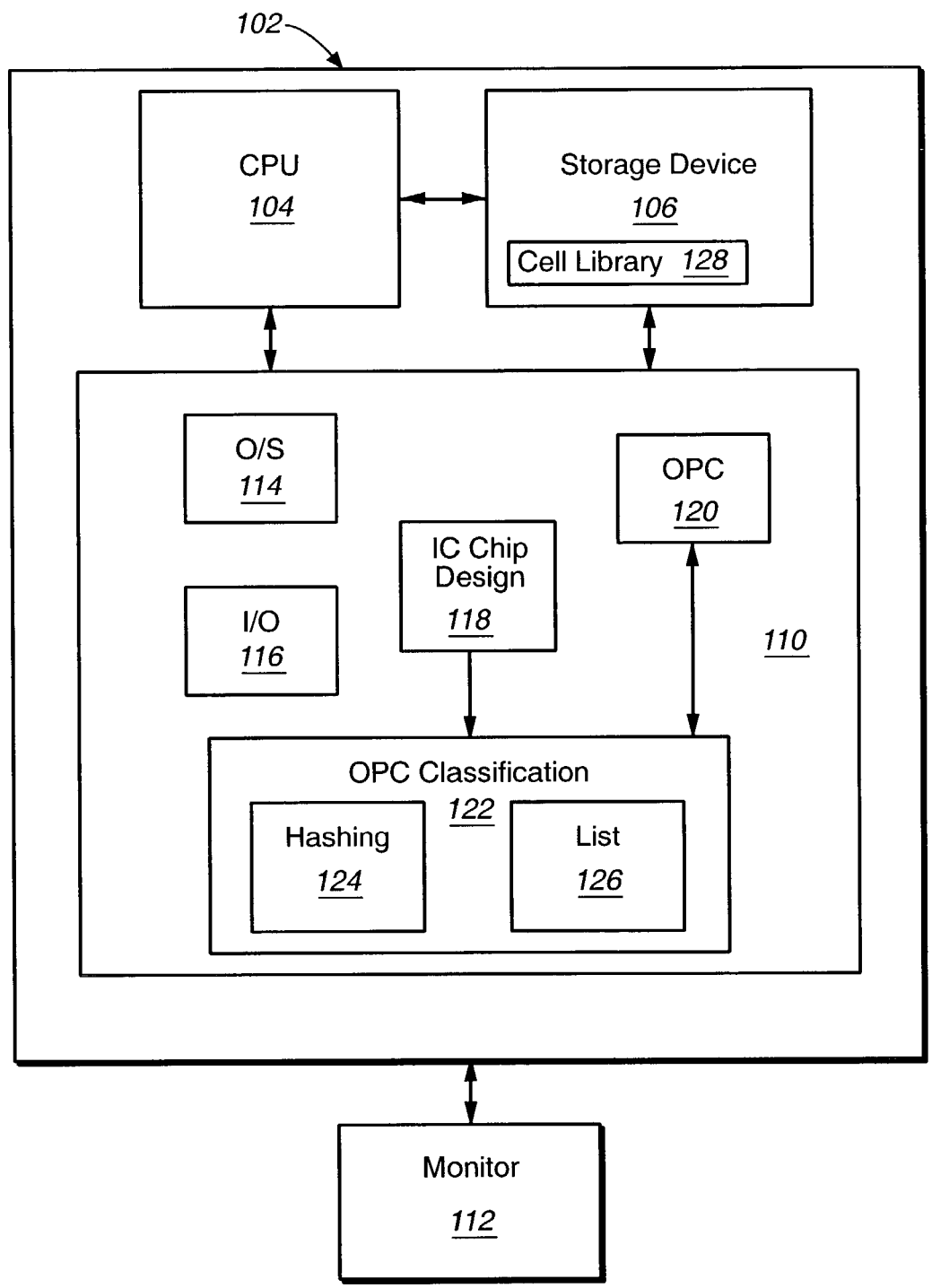
FIG._1

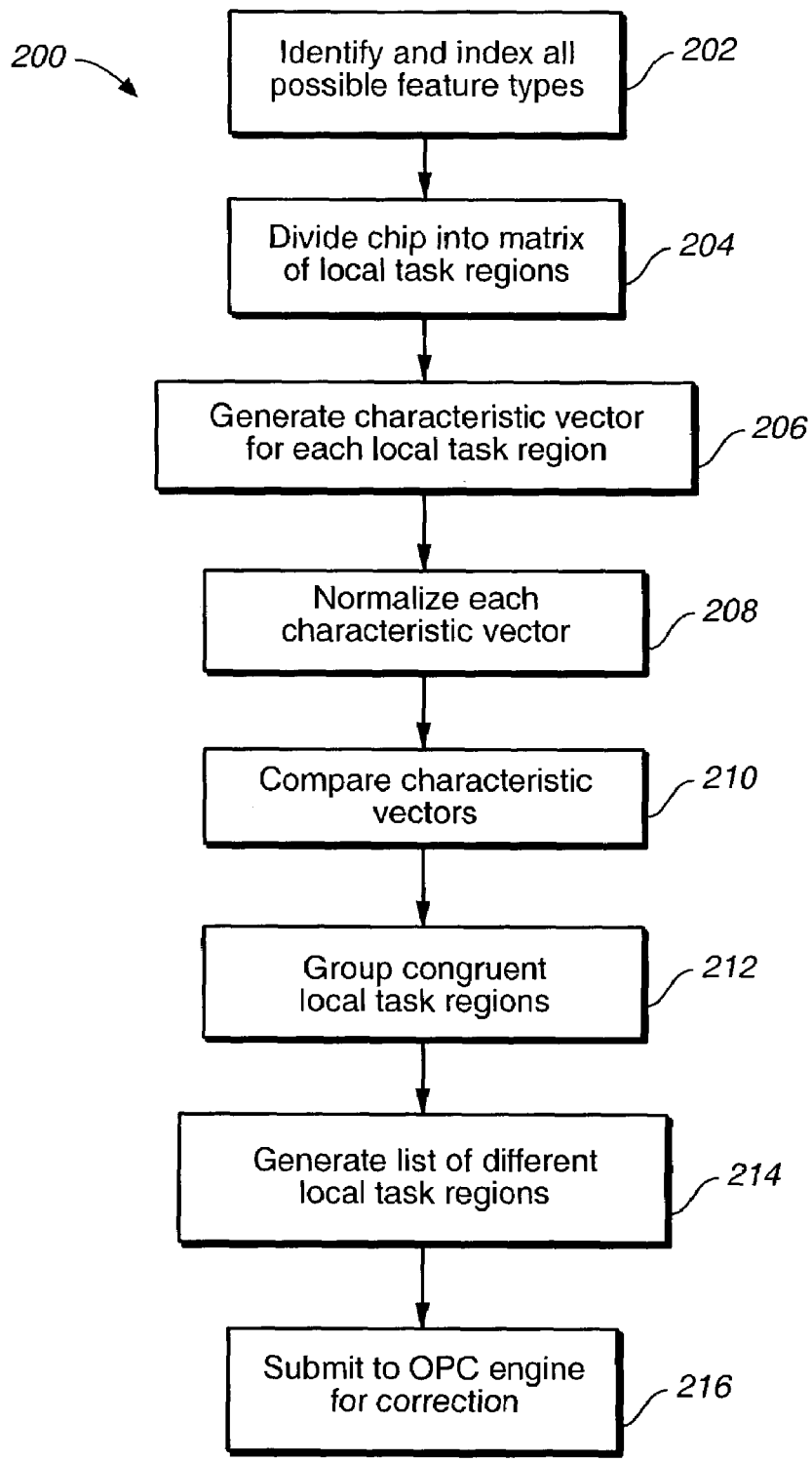
FIG._2

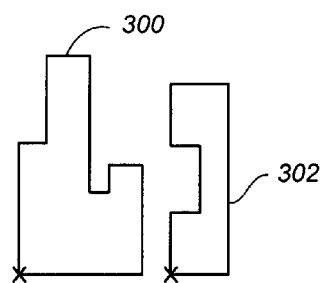
FIG._3
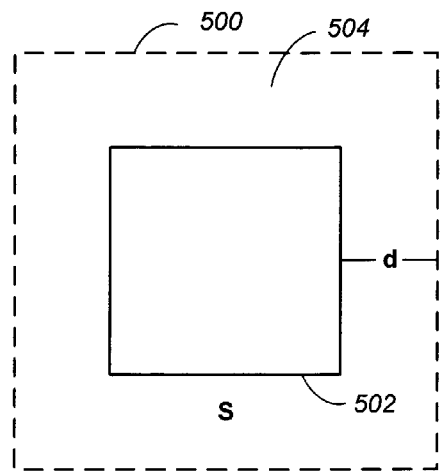
FIG._4
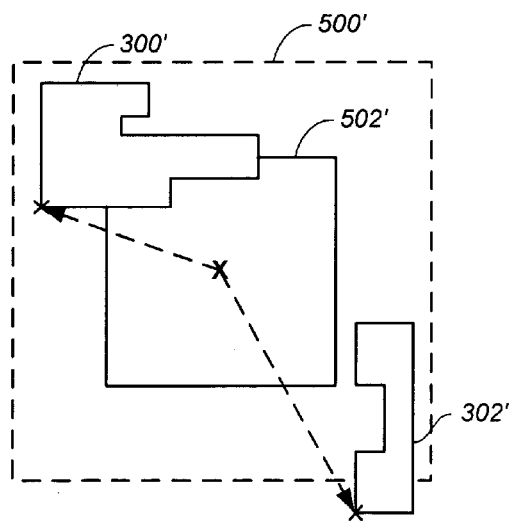
FIG._5
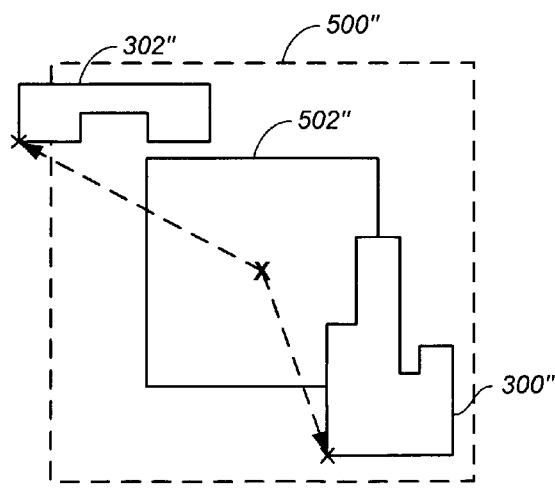
FIG._8

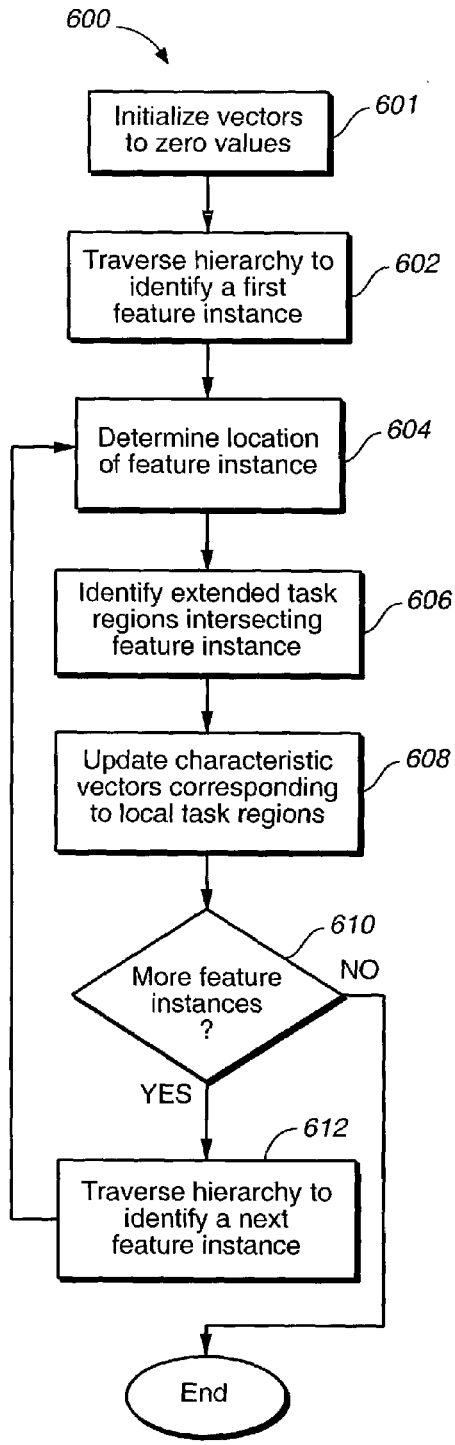
FIG._6
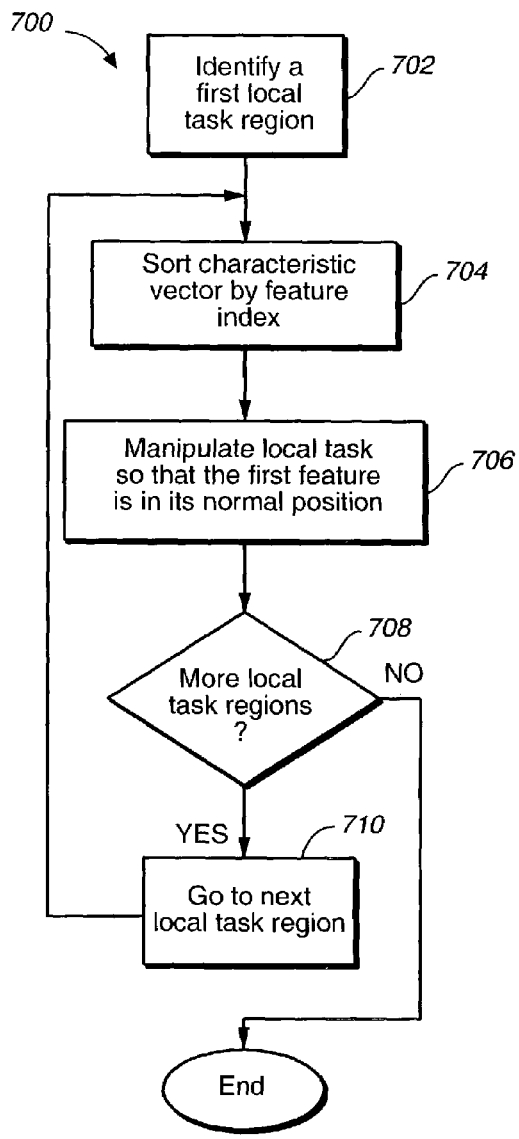
FIG._7

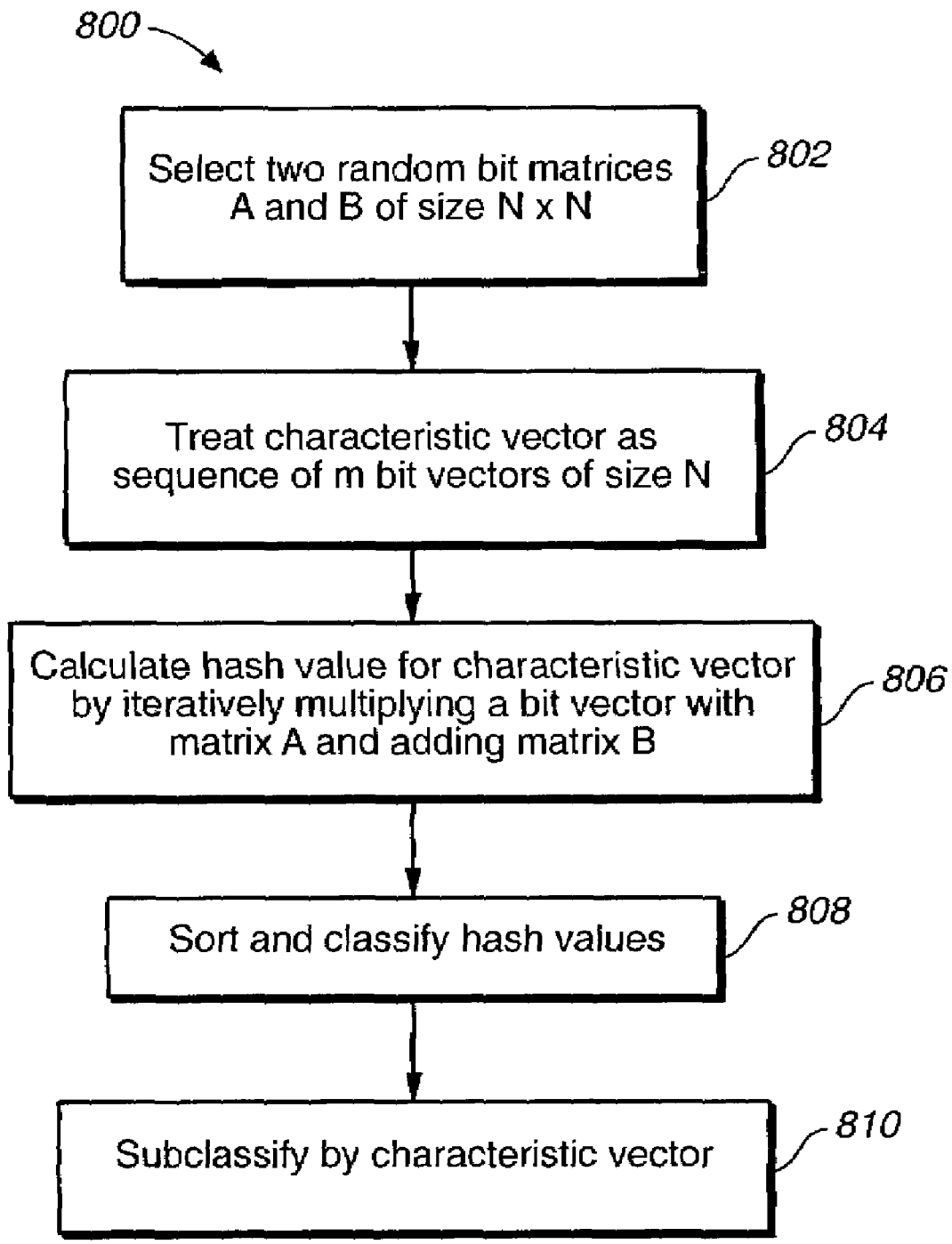
FIG._9

METHOD AND SYSTEM FOR CLASSIFYING AN INTEGRATED CIRCUIT FOR OPTICAL PROXIMITY CORRECTION

CROSS REFERENCE TO RELATED APPLICATION

This application is related to patent application Ser. No. 10/327,314 (now is U.S. Pat. No. 6,898,780) entitled "Method and System for Constnacting A Hierarchy-Driven Chip Covering for Optical Proximity Correction," filed on the same day and assigned to the same Assignee as the present application.

FIELD OF THE INVENTION

The present invention relates to integrated circuit chip design, and more particularly to performing optical proximity correction on an integrated circuit design.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers.

An integral component of photolithographic apparatus is a "reticle" which includes a pattern corresponding to features at one layer in an IC design. The reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass.

OPC, as now practiced, involves modifying a digital representation of a reticle design. The modification is performed by a computer such as workstation having appropriate software for performing OPC. Points separated by less than the critical dimension on the design are evaluated in sequence and corrected as necessary. Evaluation of each point requires analysis of surrounding features in two-dimensions to determine whether problematic diffraction effects are likely. If so, an appropriate correction (serif or segment removal, for example) is performed.

A problem with using OPC when performing a full mask design correction is that a substantial commitment must be made in terms of time and computing power in order to optically correct the integrated circuit design. For example, a moderately complex integrated circuit design may require at least a few days to correct with OPC even when the OPC algorithm runs on the fastest modern workstations.

The computational expense of OPC can be understood by recognizing that the correction often involves adding multiple small serifs to corners of design features and removing from, adding to, or displacing lateral sections of lines. The modifications are made only after evaluating an initial pattern with very fine granuiarity—typically evaluating potential correction points separated by no more than about 0.02 micrometers (using a 0.25 micron critical dimension technology). Note that a typical reticle design may include about 50–100 million "rectangles" of average size 0.5 by 0.5 micrometers. The features in and surrounding each rectangle must be evaluated in two dimensions. For example, a decision as to whether a point under consideration should be corrected may be made only after a five-by-five grid of surrounding points is first evaluated. This process is very time consuming and requires significant computational resources because enormous amounts of data must be evaluated in order to perform OPC on a single IC chip.

Accordingly what is needed is a system and method for efficiently and accurately performing OPC on an IC chip. The present invention addresses such a need.

SUMMARY OF THE INVENTION

The present invention provides a method and system for performing OPC on an IC chip by classifying the IC chip into groups of congruent tasks. The system and method of the present invention includes dividing the IC chip into a plurality of local task regions, identifying congruent local task regions, classifying congruent local task regions into corresponding groups, and performing OPC for each group of congruent local task regions.

By identifying and grouping congruent local task regions in the IC chip, according to the method and system disclosed herein, only one OPC procedure (e.g., evaluation and correction) needs to be performed per group of congruent local task regions. The amount of data to be evaluated and the number of corrections performed is greatly reduced because OPC is not performed on repetitive portions of the IC chip design, thereby resulting in significant savings in computing resources and time.

BRIEF DESCRIPTION OF THE DRAWINGS

FIG. 1 is a block diagram illustrating an environment in which the present invention may operate.

FIG. 2 is a flowchart illustrating a process for performing OPC classification in accordance with a preferred embodiment of the present invention.

FIG. 3 is a diagram illustrating two exemplary feature types.

FIG. 4 is a block diagram illustrating an exemplary local task region and its associated region of optical influence.

FIG. 5 is a block diagram illustrating an exemplary extended task region with intersecting feature types.

FIG. 6 is a flowchart illustrating a process for generating the characteristic vectors according to a preferred embodiment of the present invention.

FIG. 7 is a flowchart illustrating a process for normalizing the characteristic vectors according to a preferred embodiment of the present invention.

FIG. 8 is a block diagram illustrating the extended task region of FIG. 5 after it has been manipulated.

FIG. 9 is a flowchart illustrating a process for classifying the characteristic vectors according to a preferred embodiment of the present invention.

DETAILED DESCRIPTION

The present invention relates to a method and system for performing OPC on an IC chip design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiment shown but is to be accorded the widest scope consistent with the principles and features described herein.

As discussed above, OPC is a technique that corrects a mask design for potential light diffraction effects. In conventional systems, a mask design is fully created and is then corrected using an OPC technique. Some examples of OPC techniques are described in Otto, et al., Automate Optical Proximity Correction-A Rules-based Approach, SPIE Optical/Laser Microlithography VII, March 1994, and Helmsen et al. 3D Lithography Cases for Exploring Technology Solutions and Benchmarking Simulators, SPIE: Optical/Laser Microlithography VI, pp. 382–394, March 1994, that are incorporated herein in their entirety. As stated above, performing OPC on the entire integrated circuit design requires substantial time and computational resources because large amounts of data corresponding to millions of minute features in the mask design must be evaluated and corrected.

The method and system of the present invention is directed to reducing the amount of data evaluated for OPC by consolidating identical groups of data. An IC chip design typically is made up of a number of elements or building blocks, which are repeated throughout the chip. These building blocks are hierarchical and referred to as cells, macrocells, or cores, depending on the hierarchical position of the element. For instance, a cell might represent a simple flipflop or SRAM circuit, while a macrocell might represent a more complex element (e.g., a large adder), which incorporates several cells. The lowest level building blocks are single polygons, also called features.

While an IC chip typically includes millions of features, it generally includes a relatively small number of macrocells. Because macrocells are repeatedly utilized throughout the IC chip design, congruent (i.e., same or similar) feature arrangements are inherent.

According to the present invention, the IC chip design is divided into local task regions. Congruent, i.e., identical or similar, local task regions are then identified and grouped. By grouping congruent local task regions, the data from only one representative local task region in a group needs to be evaluated and corrected. This greatly reduces the amount of data evaluated for OPC, which in turn, saves time and computing resources. The resulting correction is applicable to all the local task regions in that group.

The present invention is implemented as a software program, which in a preferred embodiment, operates on an engineering workstation or other type of computer system 102, as shown in FIG. 1. Referring now to FIG. 1, which is a block diagram illustrating an environment in which the present invention may operate, workstation 102 includes a microprocessor 104 that is coupled to a non-volatile storage device 106, e.g., a conventional hard disk storage device. The hard disk storage 106 includes a cell library 128. The cell library 128 is a physical database representing a collection of cells and can include any combination of design elements, e.g., feature types, macrocells, cores, etc. The microprocessor 104 and the hard disk storage device 106 are coupled to a volatile storage device 110, e.g. a random access memory (RAM). A monitor 112, is coupled to the workstation 102 for displaying a user interface.

The RAM 110 stores, during operation, an operating system (O/S) 114, e.g., UNIX, a conventional input/output (I/O) module 116, an IC chip design 118, an optical proximity correction (OPC) module 120, and an OPC classification module 122. The IC chip design 118 is submitted by a designer (not shown) via the input/output (I/O) module 116. Preferably, the IC chip design 118 is described in some format, e.g., GDS II, which allows the OPC classification module 122 to interpret the design. The OPC classification module 122 is coupled to the OPC module 120, and in accordance with the present invention, classifies and submits data from IC chip design 118 to the OPC module 120 for correction.

The function of the OPC classification module 122 is discussed in conjunction with the flowchart in FIG. 2, which illustrates a process 200 for performing IC chip classification in accordance with a preferred embodiment of the present invention. Referring to FIGS. 1 and 2, the process begins in step 202 when the OPC classification module 122 identifies all possible feature types stored in the cell library 128 and used in the IC chip design 118. For each feature type, an index is assigned and an origin point is chosen, as shown in FIG. 3.

FIG. 3 is a diagram illustrating two exemplary features (300, 302) that have been indexed "1" and "2" respectively. The origin point is chosen to be the lower left corner of the feature bounding box, represented by an "x" in FIG. 3.

Referring again to FIGS. 1 and 2, once all possible feature types have been indexed, the classification module 122 divides the IC chip design 118 into a matrix of local task regions, in step 204. In a preferred embodiment, the matrix is a square matrix, each square having a size, S, whereby S is a function of the complexity of the correction procedure. Typically, the size of the local task region is in the range of 5–10 $\lambda$, where $\lambda$ is the wavelength of the light used to expose the photoresist. Preferably, S is a multiple of the IC chip design's layout grid size, which is the minimal grid used for macrocell placement during design.

Each local task region represents an area of the IC chip which will be subjected to an OPC procedure, i.e., the feature line(s) in the local task region will be subject to correction. Due to the nature of OPC and photolithography, any correction performed within the local task region may have an effect on feature lines in the area surrounding the local task region. This affected area is known as a region of optical influence.

FIG. 4 is a block diagram illustrating a local task region 502 having a size S, and its surrounding region of optical influence 504 having a size d. The region of optical influence, d, is approximately 2λ. The area defined by the local task region 502 and its surrounding region of optical influence 504 is referred to as an extended task region 500. Accordingly, when correcting the feature line(s) in the local task region 502, one must also be mindful of the feature line(s) in the extended task region 500.

Referring again to FIGS. 1 and 2, once the IC chip design 118 has been divided into local task regions (502), the classification module 122 generates a characteristic vector, C(L), for each local task region, L, in the matrix in step 206. The characteristic vector describes the features and their relative orientations and locations within the local task region 502. In a preferred embodiment, the characteristic vector is:

$C(L)=(n, (i_1, f_1, a_1, x_1, y_1), \ldots (i_n, f_n, a_n, x_n, y_n))$ where n is the number of features intersecting the extended task region 500 for L. Elements $(i_k, f_k, a_k, x_k, y_k)$ describe the $k_{th}$ feature intersecting the extended task region 500, where $i_k$ is the index of the feature type; $f_k$ and $a_k$ represent vertical flip and rotation angle, and $x_k$ and $y_k$ represent feature origin coordinates relative to the center of the local task region 502.

FIG. 5, for example, represents an extended task region 500', through which the features 1 (300') and 2 (302') (illustrated in FIG. 3) intersect. Feature 1 (300') has been flipped once along its x-axis and then rotated counterclockwise 90 degrees from its normal or original position (shown in FIG. 3). Feature 2 (302') is in its normal position, i.e., zero flip and zero rotation. If S=1600, the resulting characteristic vector for the local task region 502' will be:

$C(L_{502'})=(2, (2, 0, 0, 1000, -1800), (1, 1, 90, -1400, 400))$

Thus, for every local task region 502, a characteristic vector will be generated in step 206.

In a preferred embodiment of the present invention, the classification module 122 generates each characteristic vector by traversing the IC chip design 118, e.g., in GDS II format. As is well known to those skilled in the art, the IC chip design 118 is described hierarchically through levels of increased granularity. At the lowest level of the hierarchy are individual feature instances.

FIG. 6 is a flowchart illustrating a process 600 for generating the characteristic vectors according to the preferred embodiment of the present invention. The process begins, at step 601, by initializing all of the characteristic vectors to zero values. Then, in step 602, the classification module 122 traverses the hierarchical description of the IC chip to identify a first feature instance (e.g., feature 1 300' in FIG. 5). In step 604, the absolute location of the feature instance (300') is determined within the IC chip via the hierarchical description, as is well known to those skilled in the art.

Next, the classification module 122 identifies the extended task regions (e.g., 500' in FIG. 5) intersecting the feature instance (300') in step 606. Once the extended task regions 500' are identified, so too are the local task regions 502' affected by the feature instance 300'. In step 608, the classification module 122 then updates the characteristic vectors associated with these local task regions 502' to include the description of the feature instance 300'.

In step 610, it is determined whether more feature instances exist by, once again, traversing the hierarchical layout description. If more feature instances exist, the next feature instance (e.g., feature 2 302' in FIG. 5) is identified in step 612, and the above described process steps are repeated for each feature instance. When the entire hierarchy has been traversed and all feature instances have been analyzed, all characteristic vectors for the local task regions 502' have been updated.

Referring again to FIG. 2, once the classification module 122 has generated the characteristic vectors in step 206, they must be placed in a uniform format that allows them to be compared to one another properly. Accordingly, in step 208, the characteristic vectors are "normalized."

FIG. 7 is a flowchart illustrating process 700 for normalizing a characteristic vector in accordance with a preferred embodiment of the present invention. The normalizing process is a two step process which begins after the classification module 122 identifies a first local task region 502', via step 702. In the first step, the associated characteristic vector is sorted in increasing order by feature index in step 704. So, for example, the characteristic vector for the local task region 502' represented in FIG. 5 will be, after sorting:

$C(L_{502'})'=(2, (1, 1, 90, -1400, 400), (2, 0, 0, 1000, -1800))$

Next, in step 706, the extended task region 500' for the local task region 502' is manipulated, so that the first feature instance 300' is in its "normal" position, i.e., the vector parameters $f_i=0$ and $a_i=0$. Referring again to the extended task region 500' in FIG. 5, in order to place feature 1 (300') in its normal position, the extended task region 500' can be flipped along its y-axis and rotated counterclockwise 270 degrees. The resulting extended task region 500" after this manipulation is presented in FIG. 8.

FIG. 8 is a diagram illustrating an extended task region 500" after normalization. As is shown, feature 1 (300") is now in its normal position and feature 2 (302") has been flipped once and rotated 90 degrees counterclockwise. Thus, the resulting normalized characteristic vector for the local task region 502" is:

$C(L_{502''})'=(2, (1, 0, 0, 400, -1400), (2, 1, 90, -1800, 1000))$

Referring again to FIG. 7, in step 708, it is determined whether more local task regions 502' exist. If so, the next local task region 502' is identified (step 710) and its characteristic vector normalized according to the process described above.

Referring again to FIGS. 1 and 2, after all characteristic vectors have been normalized in step 208, they are compared to determine which local task regions 502" are congruent, via step 210. Local task regions 502" are congruent if their normalized characteristic vectors are the same. In step 212, the classification module 122 groups or classifies congruent local task regions 502", and generates a list of different local task regions 126 in step 214. In step 216, the list 126 is submitted to the OPC module 120 for correction. Thus, instead of evaluating and correcting the entire IC chip design, the OPC module 120 only evaluates and corrects the local task regions 502" on the list. The amount of data analyzed by the OPC module 120 is greatly reduced, thereby saving time and computing resources.

By comparing and classifying congruent characteristic vectors, the amount of data submitted to the OPC module for correction is greatly reduced. Nevertheless, sorting and classifying the characteristic vectors can be a cumbersome task because these vectors are typically long. Accordingly, in a preferred embodiment, a hashing unit 124 (FIG. 1) in the OPC classification module 122 hashes each normalized characteristic vector to produce a corresponding hash value.

Comparing these hash values significantly simplifies the sorting and classification process.

FIG. 9 is a flowchart illustrating a process 800 for sorting and classifying the characteristic vectors to produce the list 126 submitted to the OPC module 120, according to a preferred embodiment of the present invention. In step 802, the hash unit 124 selects two random regular bit matrices A and B of size N×N, where N is a constant, e.g., N=32. Then, each characteristic vector is treated as a sequence of bits (step 804), divided into m groups of N, such that:

$$C(L)=(X_1, \ldots, X_m)$$

where $X_1, \ldots, X_m$ are bit vectors of size N. Note that the characteristic vector is simply presented in a different way and that no manipulation or calculation is involved.

Next, in step 806, the hashing unit 124 calculates a hash value, H(L), for each characteristic vector according to the following iterative procedure:

$$H_1 = X_1$$
$$H_2 = AX\ H_1 + B$$
$$H_3 = A \times H_2 + B$$
$$\ldots$$
$$H_m = A \times H_{m-1} + B = H(L)$$

The resulting hash value, H(L), is a short, constant sized vector (e.g., 32 bits), which is practical for sorting and classifying the characteristic vectors. In step 808, sorting and classification is performed by hash value. Because there is a small, but finite, chance that non-congruent local task regions will have the same hash value, an additional subclassification by characteristic vector is performed in step 810. Thus, at the end of this process, congruent local task regions 502'' are classified without having to compare normalized characteristic vectors to one another.

A method and system for classifying an IC chip into congruent local task regions for performing OPC correction has been disclosed. By identifying and grouping congruent local task regions in the IC chip, only one OPC procedure (e.g., evaluation and correction) needs to be performed per group of congruent local task regions. The amount of data to be evaluated and the number of corrections performed is greatly reduced because OPC is not performed on repetitive portions of the IC chip design, thereby resulting in significant savings in computing resources and time.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for performing optical proximity correction (OPC) on an integrated circuit (IC) chip design, the method comprising:
    (a) dividing the IC chip into a plurality of local regions, wherein a size of each of the local regions is a multiple of a layout grid size of the IC chip, which is a minimal grid used for macrocell placement;
    (b) identifying congruent local regions including,
        (b1) generating a characteristic vector for each local region, wherein the characteristic vector for each local region describes features and relative orientations and locations of the features within the local region; and
        (b2) comparing the characteristic vectors to determine congruent local regions;
    (c) grouping congruent local regions into corresponding groups; and
    (d) performing a single OPC procedure for each group of congruent local regions.

2. The method of claim 1, wherein identifying step (b) further includes:
    (b3) normalizing each of the characteristic vectors.

3. The method of claim 2, wherein the identifying step (b) further includes:
    (b4) comparing the normalized characteristic vectors to determine congruent local regions.

4. The method of claim 2, wherein the identifying step (b) further includes:
    (b5) hashing each of the normalized characteristic vectors to produce a corresponding hash value;
    (b6) comparing the corresponding hash values; and
    (b7) subclassifying the hash values by the corresponding characteristic vectors.

5. The method of claim 1, further including:
    (e) generating a list of different local regions to be corrected; and
    (f) submitting the list to an OPC engine for correction.

6. A method for performing optical proximity correction (OPC) on an integrated circuit (IC) chip design, the method comprising:
    (a) dividing the IC chip into a plurality of local regions, wherein a size of each of the local regions is a multiple of a layout grid size of the IC chip, which is a minimal grid used for macrocell placement;
    (b) identifying congruent local regions including,
        (b1) generating a characteristic vector for each local region, wherein a size of each of the local regions is a multiple of a layout grid size of the IC chip, which is a minimal grid used for macrocell placement, wherein generating a characteristic vector includes,
            b1i) providing a plurality of feature types used in the IC chip design, wherein each feature type is assigned an index; and
            b1ii) for each local region, generating a characteristic vector based on one or more feature types intersecting an extended region for the local region, wherein the extended region comprises the local region and an area surrounding the local region corresponding to an area of optical influence;
    (c) grouping congruent local regions into corresponding groups; and
    (d) performing a single OPC procedure for each group of congruent local regions.

7. The method of claim 6, wherein the characteristic vector for a local region describes each intersecting feature type and its orientation and position relative to an origin point at a center of the local region.

8. The method of claim 6, wherein generating a characteristic vector step (b1) further includes (b1iii) normalizing each of the characteristic vectors, wherein the normalizing further includes:
    sorting the characteristic vectors by increasing feature type index; and
    manipulating the local region to place a first feature type in a predetermined original orientation.

9. The method of claim 6, wherein the generating step (b1ii) further includes:
    (b1ii(a)) initializing each characteristic vector to zero value;
    (b1ii(b)) traversing a IC chip design hierarchy to identify a first feature type instance;

(b1ii(c)) determining an absolute location on a layout grid of the identified feature type instance;

(b1ii(d)) identifying one or more extended regions intersecting the identified feature type instance, wherein an extended region comprises the local region and an area surrounding the local region corresponding to an area of optical influence; (b1ii(e)) updating the characteristic vectors corresponding to the local regions associated with the extended regions identified in step (b1iid) to describe the identified feature type instance;

(b1ii(f)) traversing the IC chip design hierarchy to identify a next feature type instance; and (b1ii(g)) repeating steps (b1ii(c)) through (b1ii(f)) until all feature type instances have been identified.

10. A computer based system for performing optical proximity correction on an integrated circuit ("IC") chip design comprising:

a storage device;

a classification module coupled to the storage device for dividing the IC chip design into a plurality of local regions, wherein a size of each of the local regions is a multiple of a layout grid size of the IC chip, which is a minimal grid seed for macrocell placement, the classification module further for identifying congruent local regions, and grouping congruent local regions into corresponding groups; and an optical proximity correction module coupled to the classification module for performing a single optical proximity correction procedure for each group of congruent local regions, wherein a plurality of feature types used in the IC chip design are stored in the storage device an wherein each feature type is assigned an index.

11. The system of claim 10, wherein the classification module further generates, for each local region, a characteristic vector based on one or more feature types intersecting an extended region for the local region, wherein the extended region comprises the local region and an area of optical influence, and wherein the characteristic vector for each local ion describes features and relative orientations and locations of e features within the local region.

12. The system of claim 11, wherein the classification module further normalizes each of the characteristic vectors.

13. The system of claim 12 further including a hashing unit coupled to the classification module for hashing each of the normalized characteristic vectors to produce a corresponding hash value, wherein the classification module compares the corresponding hash values and subclassifies the hash values by the corresponding characteristic vectors.

14. The system of claim 10, wherein the classification module further generates a list of different local regions to be corrected and submits the list to the optical proximity correction module for correction.

15. A computer readable medium containing programming instructions for performing optical proximity correction (OPC) on an integrated circuit (IC) chip design, the programming instructions for:

(a) dividing the IC chip into a plurality of local regions, wherein a size of each of the local regions of a multiple of a layout grid size of the IC chip, which is a minimal grid used for macrocell placement;

(b) identifying congruent local regions including, (b1) generating a characteristic vector for each local region, wherein the characteristic vector for each local region describes features and relative orientation and locations of the features within the local region; and (b2) comparing the characteristic vectors to determine congruent local regions;

(c) grouping congruent local regions into corresponding groups; and (d) performing a single OPC procedure for each group of congruent local regions.

16. The computer readable medium of claim 15, wherein identifyng step (b) further includes:

(b3) normalizing each of the characteristic vectors.

17. The computer readable medium of claim 16, wherein the identifying step (b) further includes:

(b4) comparing the normalized characteristic vectors to determine congruent local regions.

18. The computer readable medium of claim 16, wherein the identifying step (b) further includes:

(b4) hashing each of the normalized characteristic vectors to produce a corresponding hash value;

(b5) comparing the corresponding hash values; and (b6) subclassifying the hash values by the corresponding characteristic vectors.

19. The computer readable medium of claim 15, wherein the dividing instruction (a) includes:

(a1) providing a plurality of square local regions, wherein a size of each of the local regions is a multiple of a layout grid size of the IC chip.

20. The computer readable medium of claim 15, further including the instruction for:

(e) generating a list of different local regions to be corrected; and (f) submitting the list to an OPC engine for correction.

21. A computer readable medium containing programming instructions far performing optical proximity correction (OPC) on an integrated circuit (IC) chip design, the programming instructions for:

(a) dividing the IC chip into a plurality of local regions, wherein a size of each of the local regions is a multiple of a layout grid size of the IC chip, which is a minimal grid used for macrocell placement;

(b) identifying congruent local regions including, (b1) generating a characteristic vector for each local region, wherein the characteristic vector for each local region describes features and relative orientations and locations of the features within the local region, wherein generating a characteristic vector includes, b1i) providing a plurality of feature types used in the IC chip design, wherein each feature type is assigned an index; and b1ii) for each local task region, generating a characteristic vector based on one or more feature types intersecting an extended region for the local region, wherein the extended region comprises the local region and an area surrounding the local region corresponding to an area of optical influence;

(c) grouping congruent local regions into corresponding groups; and (d) performing a single OPC procedure for each group of congruent local regions.

22. The computer readable medium of claim 21, wherein the characteristic vector for a local region describes each intersecting feature type and its orientation and position relative to an origin point at a center of the local region.

23. The computer readable medium of claim 21, wherein the normalizing (b2) further includes:

(b2i) sorting the characteristic vector by increasing feature type index; and (b2ii) manipulating the local task region to place a first feature type in a predetermined original orientation.

24. The computer readable medium of claim 21, wherein the generating instruction (b1ii) further includes:

initializing each characteristic vector zero value;

traversing a IC chip design hierarchy to identity a first feature type instance;

determining an absolute location on a layout grid of the identified feature type instance;

identifying one or more extended regions intersecting the identified feature type instance;

updating the characteristic vectors corresponding to the local regions associated with the extend regions identified in the previous step to describe the identified feature type instance;

traversing the IC chip design hierarchy to identity a next feature type instance; and repeating the above steps until all feature type instances have been identified.

25. A method for performing optical proximity correction (OPC) on an integrated circuit (IC) chip design, the method comprising:

(a) dividing the IC chip into a plurality of local regions, wherein a size of each of the local regions is a multiple of a local grid size of the IC chip, which is a minimal grid used for macrocell placement;

(b) for each local region, generating a characteristic vector based on one or more feature types intersecting an extended region for the local region, wherein the characteristic vector for each local region describes features and relative orientations and locations of the features within the local region, wherein the extended region comprises the local region and an area surrounding the local region corresponding to an area of optical influence;

(c) normalizing each of the characteristic vectors;

(d) hashing each of the normalized characteristic vectors to produce a corresponding hash value;

(e) sorting the corresponding hash values;

(f) subclassifying the hash values by the corresponding characteristic vectors; and (g) performing a single OPC procedure for each group of characteristic vectors corresponding to congruent local regions.

26. The method of claim 25, wherein hashing step (d) further includes:

(d1) selecting a first and a second random regular bit matrix, wherein the first and the second matrices are of size N×N;

(d2) dividing each characteristic vector into m groups of N sized bit vectors; and (d3) calculating a hash value for each characteristic vector by iteratively multiplying a first group of m bit vectors with the first matrix and adding the second matrix.

27. The method of claim 26, wherein N is 32.

* * * * *